United States Patent
Ng et al.

(10) Patent No.: US 7,105,863 B1
(45) Date of Patent: Sep. 12, 2006

(54) LIGHT SOURCE WITH IMPROVED LIFE

(75) Inventors: Kee Yean Ng, Penang (MY); Kheng Leng Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/145,140

(22) Filed: Jun. 3, 2005

(51) Int. Cl.
*H01L 29/22* (2006.01)
*H01L 33/00* (2006.01)
*F21S 13/10* (2006.01)

(52) U.S. Cl. ............... 257/99; 257/100; 257/E33.058; 257/E33.059; 362/363

(58) Field of Classification Search ............... 257/99, 257/100, E33.059, E33.058; 362/363
See application file for complete search history.

(56) References Cited

U.S. PATENT DOCUMENTS

| | | | |
|---|---|---|---|
| 6,204,523 B1 | 3/2001 | Carey et al. | |
| 6,274,924 B1 | 8/2001 | Carey et al. | |
| 6,521,914 B1 | 2/2003 | Krames et al. | |
| 6,590,235 B1 | 7/2003 | Carey et al. | |
| 6,642,652 B1 | 11/2003 | Collins, III et al. | |
| 6,646,292 B1 | 11/2003 | Steigerwald et al. | |
| 6,806,583 B1 | 10/2004 | Koay et al. | |
| 2002/0028527 A1* | 3/2002 | Maeda et al. | 438/29 |
| 2004/0198924 A1 | 10/2004 | Young et al. | |
| 2005/0133810 A1* | 6/2005 | Roberts et al. | 270/99 |

OTHER PUBLICATIONS

U.S. Appl. No. 11/068,645, filed Feb. 22, 2005, Tong Fatt Chew.

* cited by examiner

*Primary Examiner*—Long K. Tran

(57) ABSTRACT

A light source has an attachment element attached to a hollow outer element. First and second leads extend through the attachment element. A light-emitting diode ("LED") die is attached to a substrate portion of a lead. Elastomeric encapsulant disposed within the hollow outer element surrounds the LED die. The light source includes a chamber between the elastomeric encapsulant and the attachment element.

17 Claims, 3 Drawing Sheets

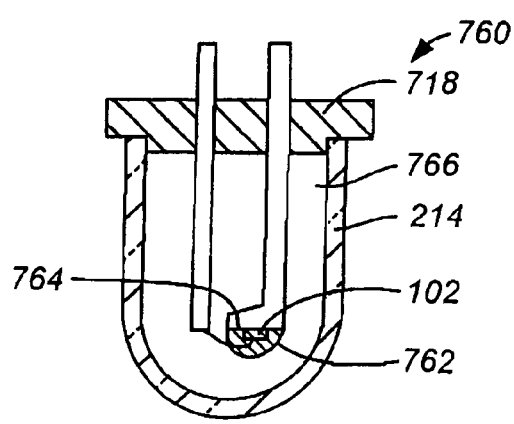
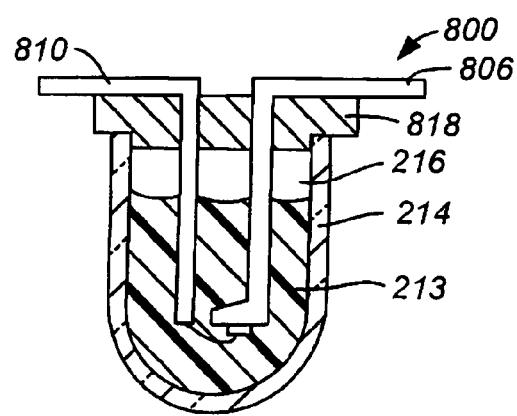
FIG. 7E
FIG. 8

LIGHT SOURCE WITH IMPROVED LIFE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

A conventional light emitting diode ("LED") device uses an epoxy polymer resin as encapsulating material. The encapsulation process is frequently accomplished by injection molding, transfer molding or casting. Cured epoxy encapsulant has relatively high hardness, which provides resistance to scratches and abrasion, high rigidity, and high initial light transmissivity. Conventional encapsulated LED devices come in a variety of sizes and styles, such as 4 mm oval LED Lamps, 5 mm round LED Lamps, chip LEDs and plastic leaded chip carriers ("PLCCs").

However epoxy-based encapsulating materials suffer from thermal- and photo-degradation. Degradation is especially acute if the wavelength emitted by the LED die is in the near ultraviolet ("UV") or UV portion(s) of the spectrum. Epoxy encapsulating material degrades when subjected to high light flux, particularly if the wavelength of the light is in the range from 200 nm to 570 nm. Degradation of the encapsulant results in increased absorption of light in the blue to green wavelengths, causing a "yellowing" effect on clear epoxy encapsulant and reduced light transmissivity through the encapsulant, which causes a significant drop in the light output of the LED device. Typically, an epoxy-based 5 mm LED lamp device's light output drops by 20% or more after 1000 hours in use, and by 50% or more after 10,000 hours in use.

Another problem with conventional epoxy-encapsulated LEDs can arise if the LED is driven with a current greater than 100 mA because heat generated by the LED during operation can degrade the epoxy. Furthermore, epoxy-based encapsulant is hard and stresses wire bonds in LED devices during temperature cycling, which can lead to premature failure.

FIG. 1 shows a conventional LED lamp 100. An LED die 102 is attached to a substrate portion 104 of a first lead 106. The backside of the LED die 102 is a first LED die terminal. A second LED die terminal 108 is connected to a second lead 110 with a bond wire 112. In a particular embodiment, the LED die is mounted in a reflector cup (not shown) of the substrate portion using conductive epoxy. The bond wire 112, LED die 102, substrate portion 104, and portions of the leads 106, 110 are encapsulated in hard, rigid epoxy encapsulant 114. The hard, rigid epoxy encapsulant 114 protects the bond wire 112 from being damaged when the LED lamp is handled during manufacturing, transport, and assembly into a circuit.

Silicone polymer materials are less prone to yellowing and thermal degradation than the epoxy used in conventional LED lamps. Silicone materials are also relatively soft, and therefore less likely to cause thermal cycling failures. However, since silicone is soft, it does not form a durable, protective, hard coating for an LED die and associated bond wire(s). Therefore, LED lamps fabricated with soft, high-temperature, non-yellowing encapsulants, yet providing a hard, durable outer cover, are desirable.

BRIEF SUMMARY OF THE INVENTION

A light source has an attachment element attached to a hollow outer element. First and second leads extend through the attachment element. A light-emitting diode ("LED") die is attached to a substrate portion of a lead. Elastomeric encapsulant disposed within the hollow outer element surrounds the LED die. The light source includes a chamber between the elastomeric encapsulant and the attachment element.

BRIEF DESCRIPTION OF THE DRAWINGS

FIG. 7E shows a cross section of a light source 760 according to another embodiment of the invention
FIG. 8 shows a cross section of a surface-mount light source according to an embodiment of the invention.

DETAILED DESCRIPTION OF THE EMBODIMENTS

Silicone elastomers offer desirable characteristics as an encapsulation material for LEDs. Silicone elastomers offer high thermal stability, low photo-degradation, low light loss transmission characteristics, a wide range of refractive indices, low stress after encapsulation cure. They are generally non-toxic and are not sensitive to high humidity and/or high temperature environments. Silicone encapsulants are particularly desirable for use with light emissions with a wavelength ranging from 200 nm to 570 nm because of the low transmission loss, and more particularly when used in high-temperature operations (i.e. over about 100° C.). Similarly, silicone encapsulants are desirable for use with longer wavelength light emissions, such as red and infrared emissions, in high-temperature applications.

Soft encapsulants, such as silicone elastomers, are also desirable for use with LED devices having wavelength-converting overlays. Particles of wavelength-converting material, such as phosphor material(s) and/or quantum dot material(s) and/or fluorescent dye, are typically dispersed in an organic resin matrix, which in some cases is silicone matrix. Such "phosphor layers" are typically less than about 10% of the thickness of the LED structure. It is desirable to avoid delaminating the phosphor layer from the LED die. The silicone—silicone interface between the phosphor layer and silicone encapsulant is minimally affected by chemical incompatibility and by mechanical incompatibility during thermal cycling.

Silicones typically generate less compressive or tensile stresses on the LED die in a package after curing compared to cured epoxy-based polymers. The reduced stress on the LED die enables a more reliable LED lamp with a longer life.

However, cured silicone encapsulants are relatively soft compared to conventional epoxy-based LED encapsulants. The low hardness of silicone polymer has the disadvantages of low resistance to scratches, abrasion and wear. Furthermore, packages formed from silicone polymer do not have high rigidity and do not provide good dimensional stability when subject to mechanical handling, thus reducing its ease of assembly and limiting the scope of its use in various LED lamp package designs.

Figure 1:
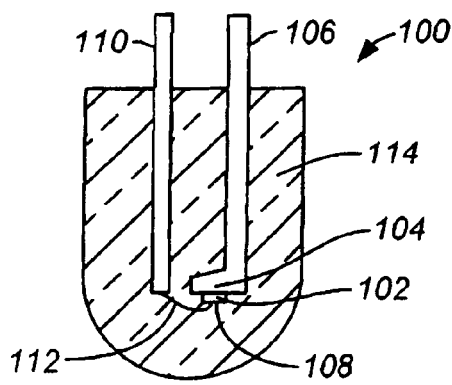
FIG. 1 shows a cross section of a conventional LED lamp.
Figure 2A:
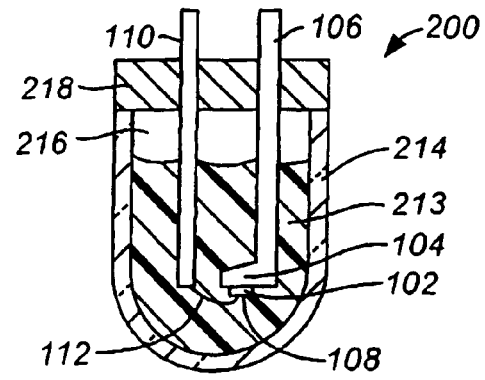
FIG. 2A shows a cross section of a light source according to an embodiment of the invention.

FIG. 2A shows a cross section of a light source 200 according to an embodiment of the invention. An LED die 102 is attached to a substrate portion 104 of a first lead 106. The backside of the LED die 102 is a first LED die terminal. A second LED die terminal 108 is connected to a second lead 110 with a bond wire 112. In a particular embodiment, the LED die is mounted in a reflector cup (not shown) of the substrate portion using conductive epoxy. The bond wire 112, LED die 102, substrate portion 104, and portions of the leads 106, 110 are encapsulated in a cured elastomeric encapsulant 213. Suitable elastomeric encapsulants include silicones, fluorosilicones, perfluoropolymers, and amphorous fluoroplastics. Suitable encapsulants include encapsulants described in U.S. Patent Application Publication No. US 2004/0198924 A1, entitled "Optically Clear High Temperature Resistant Silicone Polymers of High Refractive Index," by Young et al. Examples of suitable elastomeric encapsulants are available from NUSIL TECHNOLOGY of Carpenteria, Calif., amongst others.

A hollow outer element 214 of hard, rigid material, such as high-temperature plastic or glass, forms a cup or receptacle for the elastomeric encapsulant 213, which is typically dispensed into the outer receptacle in a fluid, semi-fluid, or gel state. The hollow outer element can be fabricated from optically clear thermoplastics or thermosetting polymers. Examples of suitable materials include liquid crystal polymers ("LCPs"), polycarbonates, and acrylics. The hollow outer element 214 provides an unflanged through-hole package outline. Alternatively shaped cups (hollow outer elements) are used to provide flanged through-hole package outlines, and surface mount outlines. In yet other alternatives, hollow outer elements with a flat surface (i.e. without a dome shape) are used.

A chamber 216 is left between the elastomeric encapsulant 213 and an attachment element 218. The attachment element 218 is secured to the hollow outer element 214 using adhesive, thermal bonding, welding, pins, slots, a heat stake(s), or by means of an interference fit, or by using other chemical, thermal, and mechanical techniques and combinations thereof. In some embodiments, the attachment element is secured to the hollow outer element to form a sealed chamber. In alternative embodiments, the chamber is unsealed. The elastomeric encapsulant 213 surrounding the LED die 102 protects the LED die 102 from environmental moisture in an unsealed chamber.

As used herein, the term "surround" means that the elastomeric encapsulant surrounds the exposed portions of the LED die, i.e., the surface(s) of the LED die that is not attached to the substrate portion. In some embodiments, the substrate portion is surrounded by the elastomeric encapsulant, and in some embodiments the substrate portion is partially covered by elastomeric encapsulant.

The chamber 216 is filled with a compressible fluid, such as air or a gas, or is evacuated. An advantage of evacuating the chamber or filling the chamber with inert gas is that less oxidation of the leads and bond wire would occur at high temperature, as compared to an oxygen-containing air environment. As the temperature of the light source 200 increases, either due to self-heating during operation or due to external heating, the elastomeric encapsulant 213 expands into the chamber 216. As the light source 200 cools, the elastomeric encapsulant 213 can contract from the chamber 216. In other words, the chamber 216 accommodates expansion and contraction of the elastomeric encapsulant 213. This provides at least two benefits.

First, a sufficiently large chamber is provided so that expanding elastomeric encapsulant does not push against the attachment element 218 to dislodge it from the hollow outer element. Thus, the connection between the attachment element 218 and the hollow outer element 214 is not damaged by expanding elastomeric encapsulant as the light source is heated. Second, the chamber allows the elastomeric encapsulant to contract from its free surface, which is adjacent to the chamber, reducing the likelihood that the elastomeric encapsulant will debond from the inner surface of the hollow outer element 214 when it contracts. Delamination will cause an air-gap between the encapsulant and the inner surface of the outer element, causing poor light extraction from the device. Thus, the light source 200 is resistant to photo-degradation and thermal-degradation, and is robust over high and low temperature fluctuations.

Figure 2B:
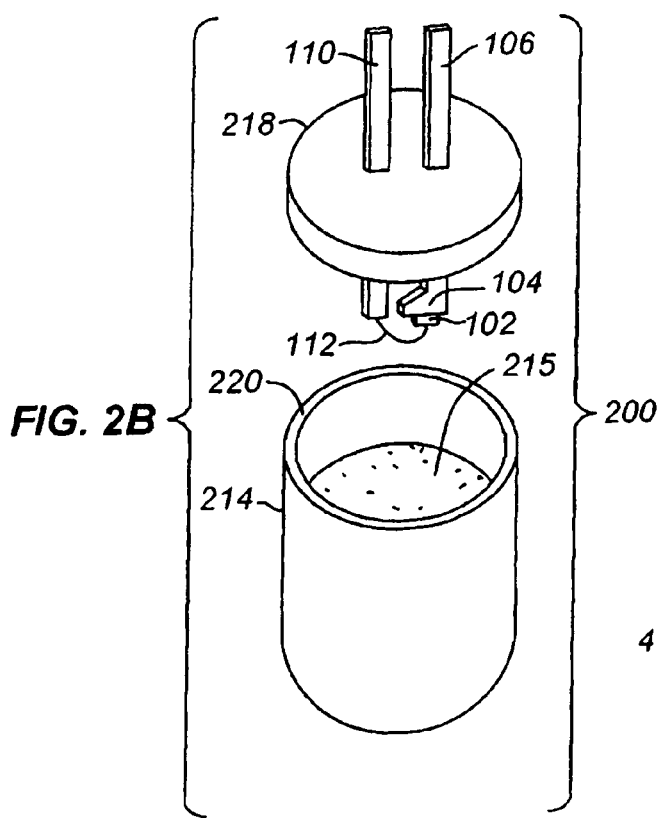
FIG. 2B is an exploded isometric view of the light source of FIG. 2A prior to assembly.

FIG. 2B is an exploded isometric view of the light source 200 of FIG. 2A prior to assembly. The leads 106, 110 are rigidly supported by the attachment element 218. The attachment element is generally a non-conductive organic or inorganic material, such as thermoplastic or thermosetting plastic compound. In a particular embodiment, the attachment element is made of a plastic molding compound commonly used to package integrated circuits, and is molded around the leads before the LED die is die attached and wire bonded to the leads. Die attaching the LED die 102 to the substrate portion 104 of the lead 106 mechanically secures the LED die to the substrate portion and electrically couples a first LED die terminal (on the backside of the LED die) to the lead 106. The bond wire 112 connects a second LED die terminal on the frontside of the LED die to the other lead 110.

The hollow outer element 214 is partially filled with uncured elastomeric encapsulant 215 to a selected level. The uncured elastomeric encapsulant 215 is typically in a fluid, semi-fluid, or gel state that allows insertion of the LED die 102, bond wire 112, and portion of the leads into the uncured elastomeric encapsulant 215 without damaging the LED die, die attachment, or bond wire. The uncured elastomeric encapsulant is then cured.

Alterntively, the attachment element is secured to the hollow outer element and uncured elastomeric encapsulant is dispensed into the hollow outer element through a hole in the attachment element for dispensing encapsulant (see FIG. 4), which is then sealed or alternatively left open. Yet other alternative techniques are used to result in the LED die at its final position in the cured elastomeric encapsulant with the chamber in the hollow outer element.

The desired level to fill the hollow outer element with uncured elastomeric encapsulant is selected so as to provide a chamber between the cured elastomeric encapsulant and the attachment element (see FIG. 2A, ref. nums. 213, 218) that accommodates thermal expansion and contraction of the cured elastomeric encapsulant over the operating temperature range of the light source 200. The attachment element 218 sits on a rim 220 of the hollow outer element, thus limiting the depth to which the LED die 102 will be inserted into the uncured elastomeric encapsulant. Positioning of the LED die 102 in the desired location (e.g. in the center of the hollow outer element 214) is accomplished using assembly tooling (not shown).

Figure 3:
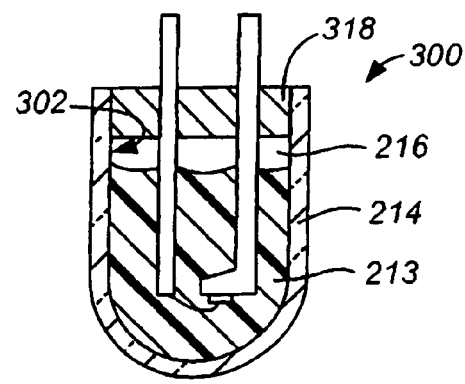
FIG. 3 shows a cross section of a light source according to another embodiment of the invention.

FIG. 3 shows a cross section of a light source 300 according to another embodiment of the invention. An attachment element 318 lies within the inner wall 302 of the hollow outer element 214. The inner wall 302 is circular (refer to FIG. 2B, ref. num. 214). The outer edge (circumference) of the attachment element self-centers the attachment element 318 in the hollow outer element 214, and operates as a mechanical alignment feature, aligning the attachment element to the hollow outer element. Assembly tooling (not shown) places the attachment 318 at the desired height within the hollow outer element 214. A chamber 216 is formed between the attachment element 318 and the elastomeric encapsulant 213.

Figure 4:
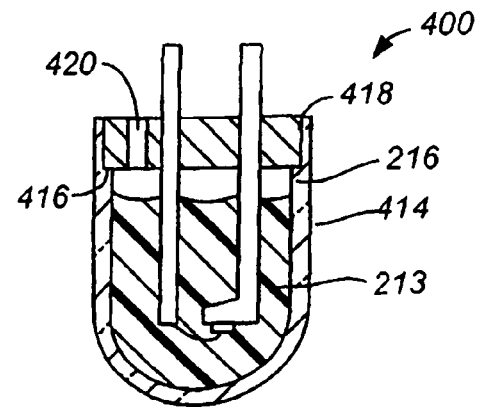
FIG. 4 shows a cross section of a light source according to another embodiment of the invention.

FIG. 4 shows a cross section of a light source 400 according to another embodiment of the invention. A hollow outer element 414 includes a step 416. The attachment element 418 sits on the step 416, thus limiting the depth of insertion of the LED device. The attachment element has a perimeter essentially the same as the inner surface of the step (e.g. round or oval), and thus acts as a mechanical alignment feature. In a particular embodiment, the hollow outer element 414 is molded from thermoplastic or glass, or cast from thermosetting plastic to include the step. The combination of the step and the inner wall of the hollow outer element 414 adjoining the attachment element 418 provides both self-centering and depth-limiting using a simple, disk-shaped attachment element. A chamber 216 is formed between the attachment element 418 and the elastomeric encapsulant 213.

A hole 420 for dispensing encapsulant extends through the attachment element 418. The hole 420 is sealed after dispensing the elastomeric encapsulant 213, or alternatively left open. Several other embodiments alternatively have holes for dispensing encapsulant. Providing a hole for dispensing encapsulant is desirable because it allows a hollow outer element to be attached to the attachment element, thus protecting the bond wire and other fragile elements, at an earlier stage in the process.

Figure 5:
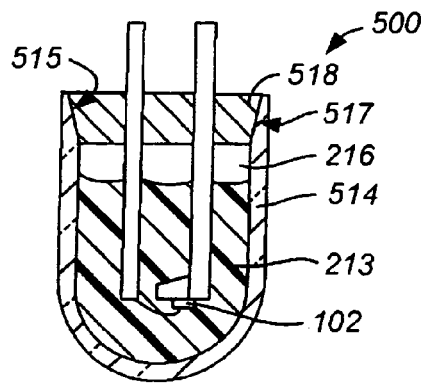
FIG. 5 shows a cross section of a light source according to another embodiment of the invention.

FIG. 5 shows a cross section of a light source 500 according to another embodiment of the invention. A hollow outer element 514 has a tapered inner wall 515 that matches a tapered outer wall 517 of an attachment element 518, providing a mechanical alignment feature. The adjoining mating tapered walls center the attachment element 518 in the hollow outer element 514 and also limit the depth of insertion of the LED die 102 into the elastomeric encapsulant 213. A chamber 216 is formed between the attachment element 518 and the elastomeric encapsulant 213.

Figure 6:
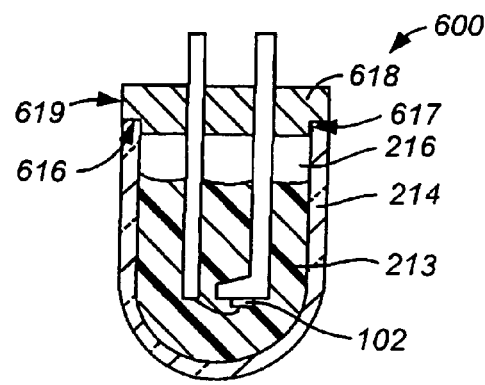
FIG. 6 shows a cross section of a light source according to another embodiment of the invention.

FIG. 6 shows a cross section of a light source 600 according to another embodiment of the invention. An attachment element 618 includes a flange portion or step 616 (compare to FIG. 4, ref. num. 414, wherein a step is provided in a hollow outer element) and a plug portion 617 that extends into the hollow outer element 214. The outer wall 619 of the attachment element 618 is flush with hollow outer element 214. The plug portion 617 centers the attachment element 618 in the hollow outer element 214, providing a mechanical alignment feature, and the flange portion 616 limits the depth of insertion of the LED die 102 into the elastomeric encapsulant 213. A chamber 216 is formed between the elastomeric encapsulant 213 and the attachment element 618.

Figure 7A:
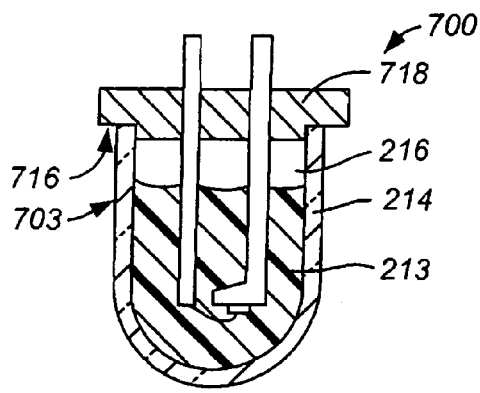
FIG. 7A shows a cross section of a light source according to another embodiment of the invention.

FIG. 7A shows a cross section of a light source 700 according to another embodiment of the invention. An attachment element 718 has a flange 716 that extends beyond an outer wall 703 of the hollow outer element 214. A chamber 216 is formed between the attachment element 718 and the elastomeric encapsulant 213. The flange 716 limits the depth of the LED die 102 into the elastomeric encapsulant, and also provides a light source with a flanged package outline.

Figure 7B:
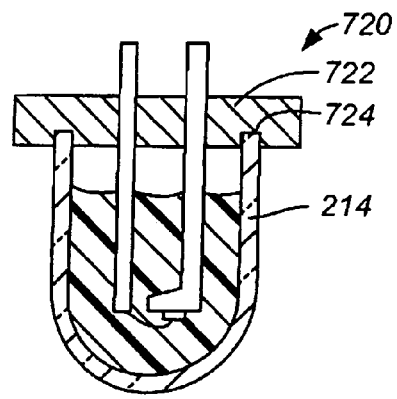
FIG. 7B shows a cross section of a light source according to another embodiment of the invention.

FIG. 7B shows a cross section of a light source 720 according to another embodiment of the invention. An attachment element 722 includes a groove 724 that receives the rim of the hollow outer element 214. The groove 724 has essentially twice the contact area between the hollow outer element 214 and the attachment element 722 compared to a similar light source according to FIGS. 6 and 7, for example.

Figure 7C:
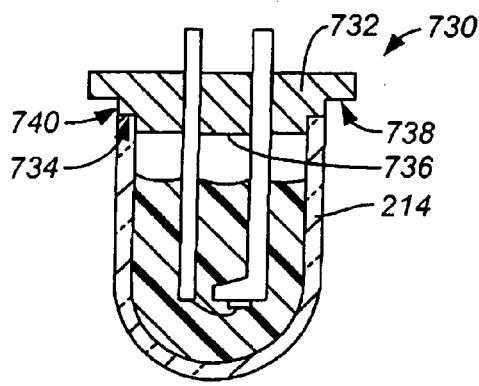
FIG. 7C shows a cross section of a light source according to another embodiment of the invention.

FIG. 7C shows a cross section of a light source 730 according to another embodiment of the invention. An attachment element 732 has a first step 734 forming a plug portion 736 that is inserted into the hollow outer element, and a second step 738 forming a flange for a flanged light source package outline. The outer wall 740 of the attachment element 732 is essentially even with the outer wall of the hollow outer element 214 between the second step 738 and the hollow outer element 214. This provides the advantage of using the same hollow outer element to produce light sources having different heights, or alternatively to increase the height of a packaged light source while using a standard hollow outer element.

Figure 7D:
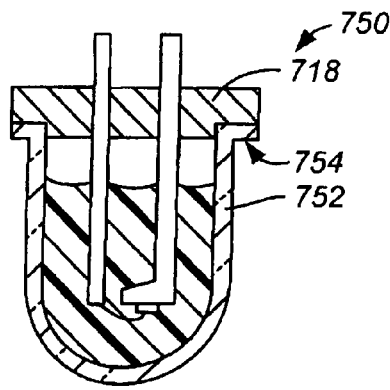
FIG. 7D shows a cross section of a light source according to another embodiment of the invention.

FIG. 7D shows a cross section of a light source 750 according to another embodiment of the invention. The light source 750 has a hollow outer element 752 with a flange 754 (compare to the non-flanged hollow outer element 214 of FIG. 7A) and an attachment element 718.

FIG. 7E shows a cross section of a light source 760 according to another embodiment of the invention. A drop (also called a dot or glob) of encapsulant 762 surrounds the LED die 102 and covers some of the substrate portion 764. Surrounding the LED die 102 with the drop of encapsulant 762 improves light extraction. Extending the drop of encapsulant to the substrate portion seals the LED die 102 with the substrate portion. An attachment element 718 is secured to a hollow outer element 214. A chamber 766 formed by the hollow outer element 214 and the attachment element 718 is filled with a compressible fluid, such as air or other gas, or is evacuated.

FIG. 8 shows a cross section of a surface-mount light source 800 according to another embodiment of the invention. Leads 806, 810 extend along an attachment element 818, facilitating attachment of the surface-mount light source 800 to a printed circuit board (not shown) or other substrate. A chamber 216 is formed between the attachment element 318 and the elastomeric encapsulant 213.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A light source comprising:
   a hollow outer element;
   an attachment element attached to the hollow outer element;
   a first lead extending through the attachment element and having a substrate portion;
   a second lead extending through the attachment element;
   a light-emitting diode ("LED") die attached to the substrate portion;
   elastomeric encapsulant disposed within the hollow outer element so as to surround the LED die; and
   a chamber disposed between the elastomeric encapsulant and the attachment element to accomodate expansion and contraction of the elestomeric encapsulant.

2. The light source of claim 1 wherein the attachment element comprises at least one of a thermoplastic and a thermosetting polymer.

3. The light source of claim 1 wherein the attachment element comprises molding compound molded around the first lead and around the second lead.

4. The light source of claim 1 wherein the LED die emits light having a wavelength shorter than about 570 nm.

5. The light source of claim 1 wherein the LED die includes a wavelength-converting overlay having a wavelength-converting material dispersed in a silicone polymer matrix.

6. The light source of claim 5 wherein the elastomeric encapsulant comprises a silicone polymer.

7. The light source of claim 1 wherein the elastomeric encapsulant comprises a silicone polymer.

8. The light source of claim 1 wherein the hollow outer element includes a step, the attachment element adjoining the step.

9. The light source of claim 1 wherein the hollow outer element includes a tapered inner wall and the attachment element includes a tapered outer wall adjoining the tapered inner wall.

10. The light source of claim 1 wherein the attachment element includes a plug portion disposed within the hollow outer element and a flange portion adjoining a rim of the hollow outer element.

11. The light source of claim 10 wherein the flange portion extends beyond an outer wall of the hollow outer element.

12. The light source of claim 1 wherein the leads extend along the attachment element so as to provide a surface-mount light source.

13. The light source of claim 1 wherein the chamber is air-filled.

14. The light source of claim 1 wherein the chamber is evacuated.

15. The light source of claim 1 wherein the attachment element includes a mechanical alignment feature.

16. The light source of claim 1 wherein the attachment element includes a hole for dispensing the elastomeric encapsulant into the hollow outer element.

17. The light source of claim 1 wherein the elastomeric encapsulant comprises a drop of elastomeric encapsulant surrounding the LED die and at least partially covering the substrate portion.

* * * * *

UNITED STATES PATENT AND TRADEMARK OFFICE
CERTIFICATE OF CORRECTION

PATENT NO.         : 7,105,863 B1
APPLICATION NO.    : 11/145140
DATED              : September 12, 2006
INVENTOR(S)        : Kee Yean Ng et al.

It is certified that error appears in the above-identified patent and that said Letters Patent is hereby corrected as shown below:

Column 7, Line 17, Claim 1, delete "accomodate" and insert -- accommodate --;

Column 7, Line 18, Claim 1, delete "elestomeric" and insert -- elastomeric --.

Signed and Sealed this

Fifteenth Day of June, 2010

David J. Kappos
*Director of the United States Patent and Trademark Office*